United States Patent [19]

Yamada

[11] 4,244,004
[45] Jan. 6, 1981

[54] METHOD FOR ANALOG-DIGITAL CONVERSION, AND A PICTURE REPRODUCTION METHOD EMPLOYING THE SAME

[75] Inventor: Mitsuhiko Yamada, Kyoto, Japan

[73] Assignee: Dainippon Screen Seizo Kabushiki Kaisha, Kyoto, Japan

[21] Appl. No.: 6,994

[22] Filed: Jan. 29, 1979

[30] Foreign Application Priority Data

Feb. 21, 1978 [JP] Japan ................................. 53-18679

[51] Int. Cl.³ .......................... H04N 1/40; H04N 5/14
[52] U.S. Cl. ............................. 358/138; 340/347 AD; 358/263
[58] Field of Search .................. 340/347 M; 358/138, 358/263, 134, 280; 364/575; 328/151

[56] References Cited

U.S. PATENT DOCUMENTS

| | | | |
|---|---|---|---|
| 2,989,741 | 6/1961 | Gordon et al. | 340/347 M |
| 3,800,225 | 3/1974 | Meares | 325/38 B |
| 3,879,724 | 4/1975 | McDonald | 328/158 |
| 4,057,836 | 11/1977 | Munsey | 358/134 |

*Primary Examiner*—Robert L. Griffin
*Assistant Examiner*—Joseph A. Orsino, Jr.
*Attorney, Agent, or Firm*—Zarley, McKee, Thomte, Voorhees & Sease

[57] ABSTRACT

A method of analog-digital conversion is disclosed, wherein sub-sampling of an analog signal is performed at a certain multiple n of the basic sampling rate, and wherein from n consecutively-produced values representative of the analog signal the digital signal to be output is calculated.

8 Claims, 9 Drawing Figures

(a)

(b)

METHOD FOR ANALOG-DIGITAL CONVERSION, AND A PICTURE REPRODUCTION METHOD EMPLOYING THE SAME

This invention relates to a method for analog-digital conversion, wherein an analog signal is sampled and a digital signal is output which corresponds to the analog signal. It further relates to a picture reproducing method which uses this method of analog-digital conversion, and to a picture reproducing machine which uses this method of picture reproduction.

In a machine for reproducing a picture, wherein an original picture is scanned and analog picture signals are produced, the analog picture signals are converted into digital picture signals by sampling according to a certain sampling frequency, these digital picture signals are stored into a memory, and then these digital picture signals are read out, converted into analog output picture signals, and then a reproduction picture is produced by using these analog reproduction picture signals. Thus the frequency range of the analog signal reproducible faithfully generally depends upon the sampling frequency, and, the higher is the sampling frequency, the finer detail can be reproduced. However, the higher is the sampling frequency, the greater is the capacity required for the memory, which involves a higher cost. Thus in practice limitations are imposed on the sampling frequency.

FIGS. 1 and 3 show conventional sampling at a period of $1/f_0$, wherein as shown by the solid lines the analog signal level is sampled at the start point of each sampling period and a digital output signal is produced which corresponds to this sampled value. As a result faithful picture signals are not always produced, the end points may be shifted, and a less than perfect analog-digital conversion process is performed.

It is an object of the present invention to provide an A-D conversion method for an analog signal which is an improvement over the aforementioned one, which avoids the defects as outlined above, and which is reliable.

Further, it is an object of the present invention to provide a method of picture reproduction which performs analog-digital conversion using the above-mentioned method.

According to the present invention, there is provided a method of analog-digital conversion, wherein digital signals are produced at a certain sampling rate corresponding to an analog signal, wherein values representative of the analog signal are produced at a frequency which is some multiple n of the sampling rate, and wherein each digital signal produced is calculated from n consecutively-produced ones of these representative values.

In order that the present invention may be better understood, preferred embodiments will now be described, with reference to the accompanying drawings, which, however, are given for the purposes of illustration only, and are therefore not limitative of the present invention. In these drawings.

Figure 1:
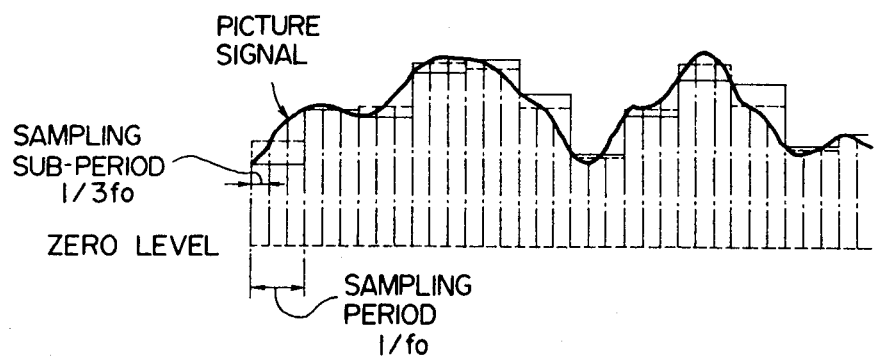
FIG. 1 is a schematic view showing sampling picture signals obtained according to the present invention, as shown by broken lines; and according to a conventional method, as shown by solid lines.

In FIG. 1 is shown one embodiment of a method of sampling picture signals according to the present invention, as shown by broken lines, contrasted to a conventional method, as shown by solid lines, wherein a curved solid line shows a picture signal, and slight time delays of the sampling signals with respect to the picture signal may be neglected.

According to the present invention, the frequency of signals for sampling an analog picture signal is raised. For instance, the picture signal is converted into binary-coded-digit (BCD) signals by sampling-sub-signals having a frequency of $3 \times f_0$, which is three times as high a frequency as that of the sampling signals, having a frequency of $f_0$. That is, the sampling period $1/f_0$ of the sampling signal is three times as large as that, $\frac{1}{3}f_0$ of the sampling-sub-signal, as illustrated in FIG. 1. The level of the sampling signal is the mean value of those of the sampling sub-signals which are included in the sampling period of the sampling signal.

In this case, particularly when the above method is being used in a picture reproducing machine as outlined above, the frequency of the signal for sampling the analog picture is raised, but the output number of the sampling signals which are sent to the memory is the same, as in a conventional method. Thus the conventional memory can be used, without increasing its capacity. Furthermore, the sampling picture signal reproduced is faithful to the original picture signal, and thus the contrast of the picture reproduction may be improved.

Figure 2:
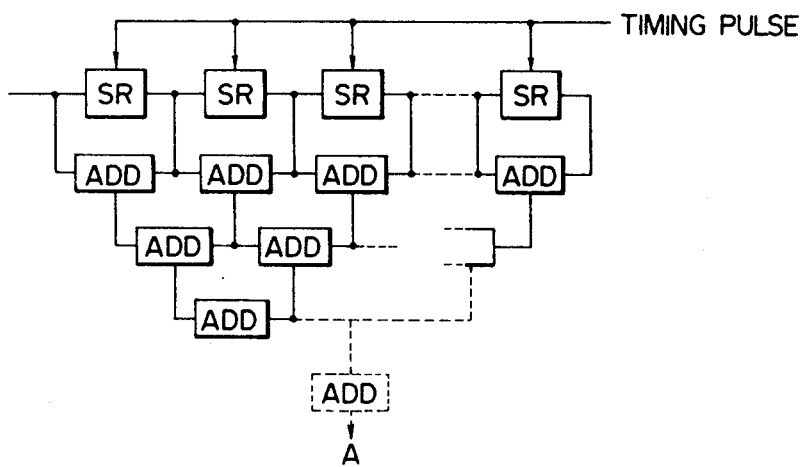
FIG. 2 is a schematic view of a circuit for sampling a picture signal according to the present invention.

In FIG. 2 is shown an averaging circuit for the mean value of the level of the sampling-sub-signals, wherein their frequency is $n \times f_0$, wherein n is an integer greater than 1, and $f_0$ is the frequency of the sampling signal.

In this circuit, the BCD signals obtained from the picture signal by sampling are recorded into shift registers SR in synchronization with timing pulses having the same frequency as the sampling-sub-signals. The two BCD signals are input to each adder ADD in which the two BCD signals are added and averaged by omitting their last bit. Such averagings are repeated in the adders, thereby obtaining the mean value A of the levels of the sampling sub-signals.

In practice, the number n is usually three, since if four sampling-sub-signals are employed the sampling signal frequency becomes rather low.

Figure 3:
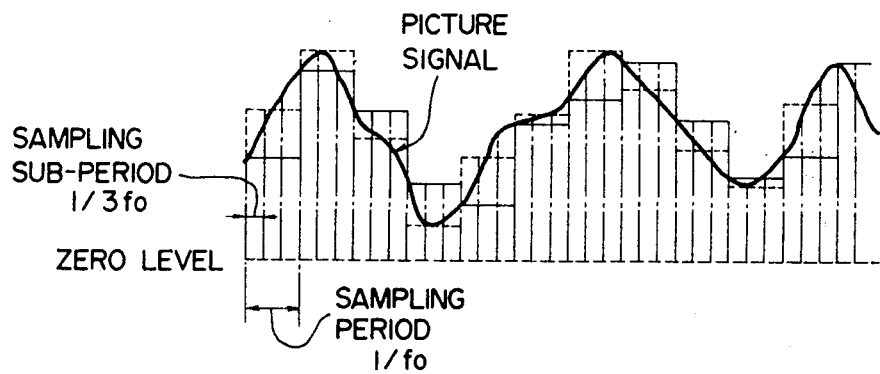
FIG. 3 is a schematic view showing other sampling picture signals obtained according to the present invention, as shown by broken lines; and according to a conventional method, as shown by solid lines.

In FIG. 3 is shown another embodiment of the present invention, wherein the sampling of picture signals is shown by broken lines, and wherein a conventional method is shown by solid lines, for the purposes of comparison. Slight time delays of the sampling signals with reference to the picture signal may be neglected.

In this case, the method of the present invention is almost the same as that of FIG. 1, except that n is definitely always three, and when of the three sampling sub-signals formed during one sampling period the second is the maximum or the minimum, i.e. the extreme one, than the value of this second one is taken for the level of the sampling signal. Otherwise, the mean or average of the three is taken. Thereby, the same functions and results as in the embodiment of FIG. 1 can be obtained.

Figure 4:
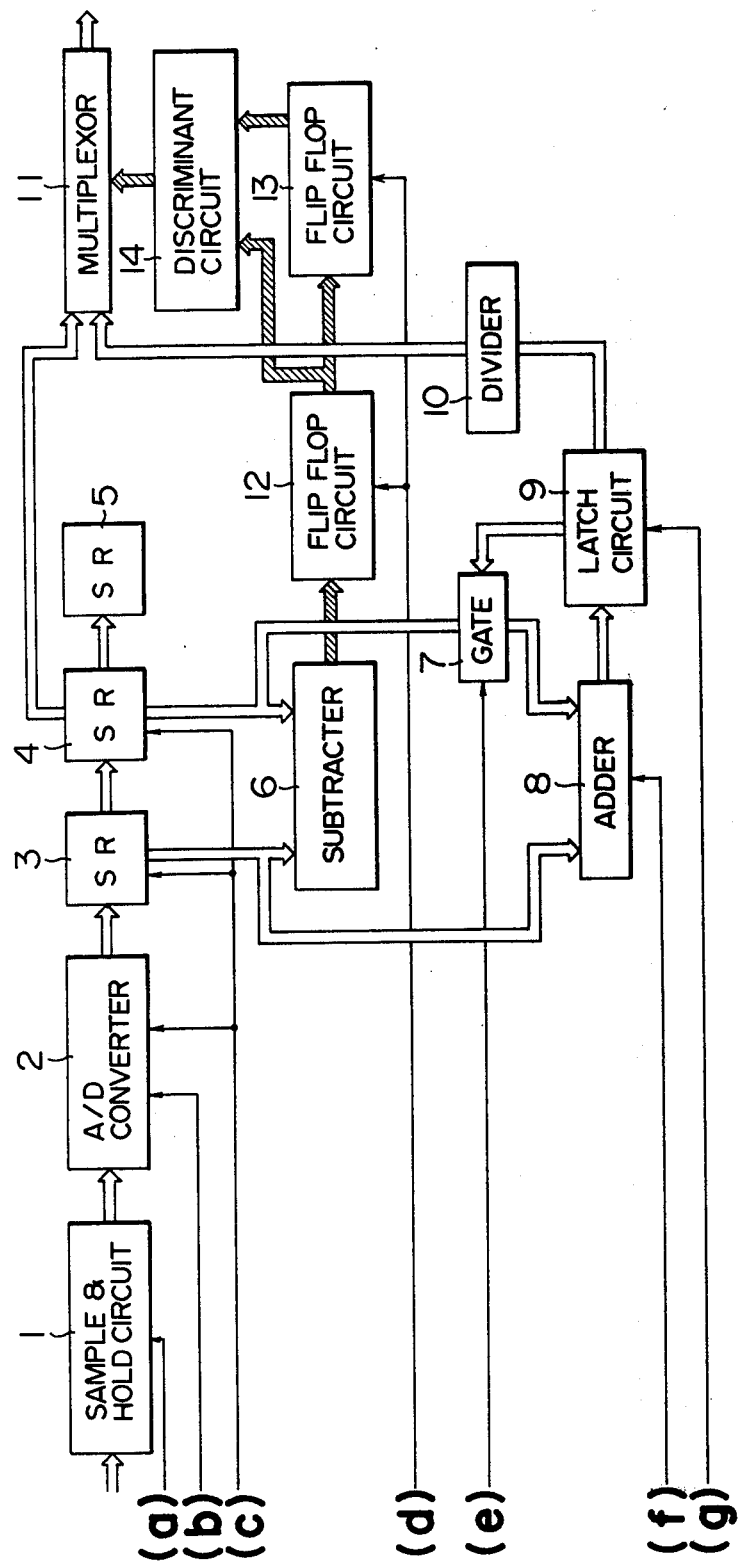
FIG. 4 is a block diagram of a device for sampling a picture signal according to the present invention.

In FIG. 4 is shown a block diagram for carrying out the method of FIG. 3.

Figure 5:
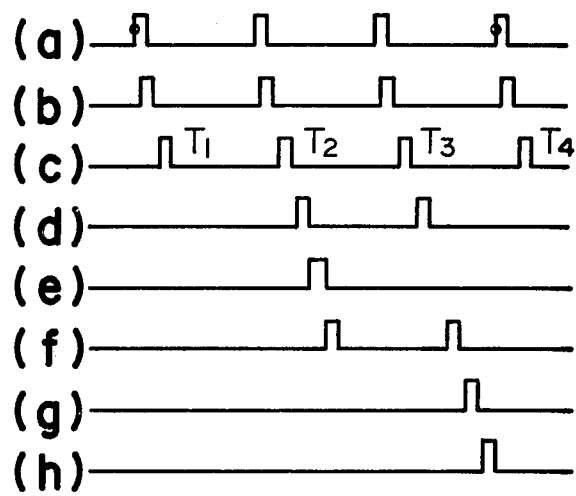
FIG. 5 is a schematic view of a time chart of timing pulses in FIG. 4.

The analog signal such as a picture signal is input to a sample and hold circuit 1 and is sampled there in synchronization with a timing pulse shown in FIG. 5a, having the same frequency $3f_o$ as the sampling-sub-signals. The analog signal sampled is converted into a digital signal in an analog-digital converter 2 in synchronization with a timing pulse shown in FIG. 5b.

Figure 6:
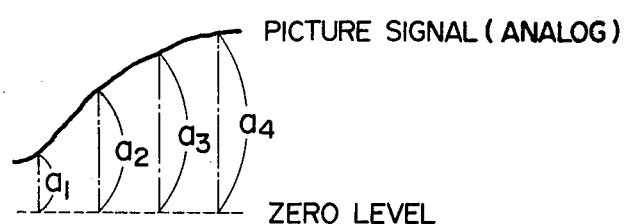
FIG. 6 is a schematic view of a sampling method of a picture signal according to the present invention.

The digitalized signal is then recorded sequentially in shift registers 3, 4, and 5 in synchronization with a timing pulse shown in FIG. 5c. That is, digital values of the signal $a_1$, $a_2$, $a_3$, $a_4$, . . . shown in FIG. 6, which are obtained by sampling the analog picture signal, are produced. The value $a_1$ is recorded in the shift register 3 by a timing pulse $T_1$ of FIG. 5c. The value $a_1$ is then shifted to the shift register 4, and the value $a_2$ is simultaneously recorded into the shift register 3 by a timing pulse $T_2$ of FIG. 5c.

In a subtracter 6 the calculation $a_1-a_2$ is simultaneously carried out by, for instance, a magnitude comparator, and when the value $a_1-a_2$ is positive or at least zero the subtracter 6 outputs a high level signal "H", whereas when the value $a_1-a_2$ is negative the subtracter 6 outputs a low level signal "L". In any case, the level signal, be it "H" or "L", is input to a flipflop circuit 12 in synchronization with a timing pulse shown in FIG. 5d.

Almost at the same time the value $a_1$ is fed from the shift register 4 to an adder 8 through a gate 7 in synchronization with a timing pulse shown in FIG. 5e, and there the value $a_1$ is added to the value $a_2$ which is fed from the shift register 3. The value $a_1+a_2$ is sent to a latch circuit 9 in synchronization with a timing pulse shown in FIG. 5f.

Then the values $a_1$ and $a_2$ are shifted from the shift registers 4 and 3 to the shift registers 4 and 5, and the value $a_3$ is input to the shift register 3 by the timing pulse $T_3$ of FIG. 5c.

Simultaneously, the calculation $a_2-a_3$ is carried out in the same manner as described above in the subtracter 6. The subtracter 6 outputs either a high-level signal or a low-level signal to the flipflop circuit 12, and the signal previously held in the flipflop circuit 12 is sent to a flipflop circuit 13 at the same time.

The value $a_1+a_2$ is fed from the latch circuit 9 via the gate 7 to the adder 8. When the value $a_3$ is input from the shift register 3 to the adder 8, the adder calculates the value $a_1+a_2+a_3$. The value $a_1+a_2+a_3$ is sent to a divider 10 via the latch circuit 9 in synchronization with a timing pulse shown in FIG. 5g. The divider outputs the mean value $(a_1+a_2+a_3)/3$ to a multiplexor 11. The value $a_2$ is also fed from the shift register 4 to the multiplexor 11.

This multiplexor 11 passes either the value $a_2$, i.e. the value of the second one of the three sub-sampled values, or the value $(a_1+a_2+a_3)/3$, i.e., the mean value, and which of these is passed is selected by the control signal from an extreme value discriminant circuit 14. The passed on value is sent on to the following device, such as a memory, in synchronization with a timing pulse shown in FIG. 5h.

Figure 7:
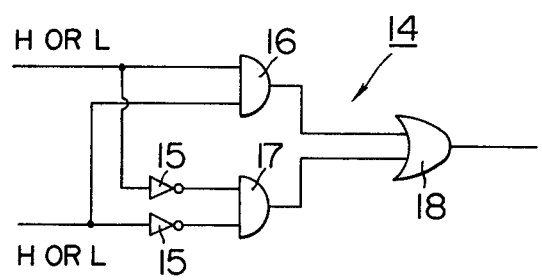
FIG. 7 is a schematic view of an extreme-value-discriminant circuit in FIG. 4.

In FIG. 7 there is shown one embodiment of the discriminant circuit 14, comprising inverters 15, AND circuits 16 and 17, and an OR circuit 18.

The high level signal "H" or the low level signal "L" sent to the flipflop circuits 12 and 13 from the subtracter 6 is fed to the discriminant circuit 14 depending on the positive or negative value of the calculations $a_1-a_2$ and $a_2-a_3$.

Figure 8:
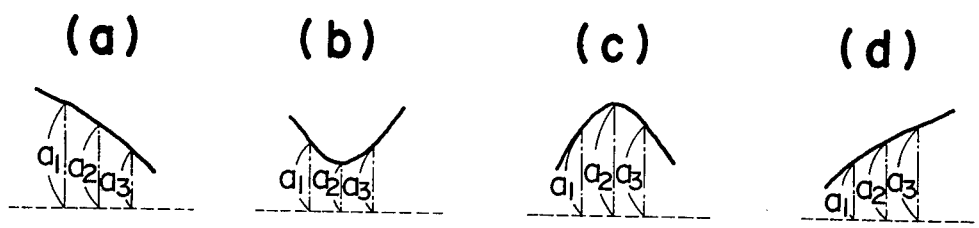
FIG. 8 is a schematic view of a sampling method of various picture signals according to the present invention.

When $a_1-a_2$ is positive, and $a_2-a_3$ is positive, as shown in FIG. 8a, the high level signals are input to the AND circuit 16, and are input to both the inverters 15 where they are inverted to the low level signals which are input to the AND circuit 17. Therefore the OR circuit 18 receives a low level signal from the AND circuit 17 and a high level signal from the AND circuit 16, and therefore it outputs a high level signal. Therefore the multiplexor passes the mean value signal $(a_1+a_2+a_3)/3$.

When $a_1-a_2$ is positive, and $a_2-a_3$ is negative, as shown in FIG. 8b, or $a_1-a_2$ is negative, and $a_2-a_3$ is positive, as shown in FIG. 8c, then both of the AND circuits 16 and 17 are each fed with one high and one low level signal, and therefore the two inputs to the OR circuit 18 are both low-level signals, and therefore the output of the OR circuit 18 is a low-level signal. In this case, the multiplexor passes the extreme value $a_2$.

When, finally, both $a_1-a_2$ and $a_2-a_3$ are negative, as shown in FIG. 8d, the low level signals are fed to the AND circuit 16, and the two high level signals, which are obtained by inverting the low level signals in the inverters 15, are fed to the AND circuit 17. Thus the OR circuit 18 outputs a high level signal. In this case, the multiplexor outputs the mean value $(a_1+a_2+a_3)/3$.

From the above description it is readily understood that according to the present invention the sampling picture signal similar to the picture signal may be obtained, as shown in FIG. 3 by the broken lines.

According to the present invention, of course, the sampling sub-signals formed during one sampling period are not restricted to three.

Figure 9:
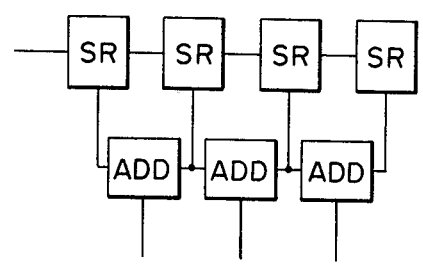
FIG. 9 is a schematic view of other circuits for sampling a picture signal according to the present invention.
Figure 9:
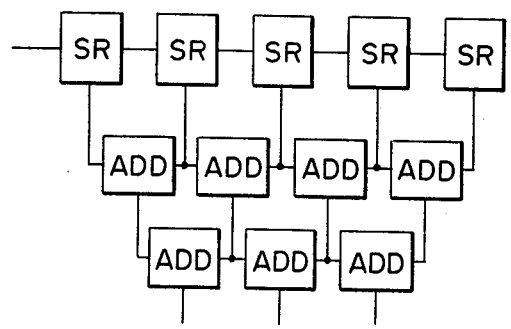

When more than three sampling sub-signals are formed during one sampling period, the sampling sub-signals are pretreated in a particular averaging circuit comprising a combination of the shift registers of the corresponding number to the sampling sub-signals, and the adders, such averaging circuits for four and five sampling sub-signals are shown in FIG. 9a and b, so as to obtain three mean value output signals to be input consecutively to the three shift registers 3–5 in FIG. 4.

According to this process, a more faithful digital rendering of the analog input signal is obtained than in the case of the first embodiment described above with reference to FIG. 1. This is because in the cases illustrated in FIGS. 8b and 8c, where the analog input signal is passing through a maximum or a minimum, if the average of the three signals $a_1$, $a_2$ and $a_3$ is taken, this does not truly represent the extreme value of the analog signal. Therefore in these cases the extreme value is taken. A very significant increase in the quality of digitalization is obtained by this method, and particularly in the case outline above, where the method is used in picture reproduction, where the need for correctly representing extreme values is very marked, since these may correspond to thin lines of sharp contrast in the picture, which need to be faithfully reproduced, without softening.

Although the invention has been shown and described with reference to several preferred embodiments thereof, it should be understood that various changes and modifications of the form and the content thereof may be made therein without departing from the spirit of the invention. For instance, in its essence the invention is not restricted to digitalization in a picture scanning reproducer, but may be applied anywhere where A-D conversion is required. Many other alterations may be made. Therefore it will be understood that the invention and its scope are not to be liminted by any details of the embodiments shown and described, or of the drawings, which were all given for the purposes of illustration only, but solely by the appended claims.

What is claimed is:

1. A method of analog-digital conversion, wherein digital signals are produced at a certain sampling frequency rate corresponding to an analog signal, wherein values representative of the analog signal are produced at a frequency rate which is some multiple n of the sampling frequency rate, and wherein each digital signal produced is obtained by using n consecutively-produced ones of these representative values, characterized in that: said digital signal is produced from three input values obtained from the consecutively-produced representative values, said digital signal being produced from the second one of the three input values if said second one is the maximum or the minimum of said three input values, otherwise, said digital signal being produced from the average of the three input values.

2. A method as in claim 1, wherein n is three, and wherein the three input values are the consecutively-produced representative values.

3. A method as in claim 1, wherein n is more than three, and wherein the three input values are obtained from the consecutively-produced representative values by calculating in an averaging circuit.

4. A method as in claim 3, wherein the averaging circuit comprises a combination of shift registers of the corresponding number to the consecutively-produced representative values, and adders.

5. A method of picture reproduction, comprising scanning an original picture and producing an analog original picture signal; wherein said analog original picture signal is converted into a digital original picture signal; wherein the digital original picture signal is converted into an analog reproduction picture signal which is used to produce a reproduction picture; wherein the digital original picture signal is produced at a certain sampling frequency rate; and wherein values representative of the analog original picture signal are produced at a frequency rate which is a multiple n of the sampling frequency rate, said digital original picture signal being obtained by using n consecutively-produced ones of these representative values: characterized in that said digital original picture signal is produced from three input values obtained from the consecutively-produced representative values, said digital original picture signal being produced from the second one of the three input values if said second one is maximum or the minimum of said three input values, otherwise, said digital original picture signal being produced from the average of the three input values.

6. A method as in claim 5, wherein n is three, and wherein the three input values are the consecutively-produced representative values.

7. A method as in claim 5, wherein n is more than three, and wherein the three input values are obtained from the consecutively-produced representative values by calculating in an averaging circuit.

8. A method as in claim 7, wherein the averaging circuit comprises a combination of shift registers of the corresponding number to the consecutively-produced representative values, and adders.

* * * * *